(12) United States Patent
Yang (10) Patent No.: US 7,705,765 B1
(45) Date of Patent: Apr. 27, 2010

(54) SYSTEMS AND METHODS FOR CHARACTERIZING COMPONENT RATIOS AND GENERATING A DIGITAL REPRESENTATION OF SAME

(75) Inventor: Heemin Yang, San Francisco, CA (US)

(73) Assignee: Linear Technology Corporation, Milpitas, CA (US)

( * ) Notice: Subject to any disclaimer, the term of this patent is extended or adjusted under 35 U.S.C. 154(b) by 47 days.

(21) Appl. No.: 12/287,598

(22) Filed: Oct. 10, 2008

(51) Int. Cl.
*H03M 1/12* (2006.01)
(52) U.S. Cl. ...................... 341/172; 341/155
(58) Field of Classification Search ........... 341/172, 341/155, 156, 169, 170
See application file for complete search history.

(56) References Cited

U.S. PATENT DOCUMENTS

| | | | |
|---|---|---|---|
| 5,581,252 A * | 12/1996 | Thomas | 341/144 |
| 5,684,487 A | 11/1997 | Timko | |
| 6,480,137 B2 * | 11/2002 | Kulkarni et al. | 341/172 |
| 6,587,066 B1 * | 7/2003 | Somayajula | 341/172 |
| 6,853,324 B2 * | 2/2005 | Maeda et al. | 341/150 |
| 6,985,101 B2 * | 1/2006 | Leung et al. | 341/172 |
| 7,355,536 B2 | 4/2008 | Dempsey et al. | |

OTHER PUBLICATIONS

Ginsburg, Brian and Anantha Chandrakasan, "An Energy-Efficient Charge Recycling Approach for a SAR Converter with Capacitive DAC," IEEE, 2005, pp. 184-187.
Lee, Hae-Seung and David A. Hodges, "Circuits and Systems Letters: Self-Calibration Technique for A/D Converters," IEEE, 1983, pp. 188-190.

* cited by examiner

*Primary Examiner*—Peguy JeanPierre
(74) *Attorney, Agent, or Firm*—McDermott Will & Emery LLP (57) ABSTRACT

Circuits and methods for determining component ratios are provided. An analog to digital converter circuit may include comparison capacitors arranged in an upper group and a lower group for quantizing analog signals into the digital domain. In addition to determining the lower bits during an analog to digital conversion of an input sample, the lower group of comparison capacitors may also be used during calibration mode to quantize a ratio signal that represents the capacitor mismatches of the upper group rather than using a dedicated digital-to-analog converter to perform this function.

41 Claims, 7 Drawing Sheets

SYSTEMS AND METHODS FOR CHARACTERIZING COMPONENT RATIOS AND GENERATING A DIGITAL REPRESENTATION OF SAME

BACKGROUND OF THE INVENTION

The invention relates to component ratio determination. More particularly, the invention relates to systems and methods for determining component ratios and the application of correction factors in sampling systems.

Although real world signals are analog, it is often desirable to convert them into the digital domain using analog to digital converters (ADCs). Circuit designers are motivated to perform this conversion because of the efficient methods currently available for the transmission, storage and manipulation of digital signals. A digital representation of an audio signal, for example, allows a CD player to achieve virtually error free storage using optical discs. The need for complicated signal processing may also necessitate analog-to-digital conversion because such signal processing is only feasible in the digital domain using either digital computers or special purpose digital signal processors. Signal processing in the digital domain is also particularly useful in such areas as biomedical applications to provide the required accuracy for such tasks such as magnetic resonance imaging (MRI).

In operation, an analog to digital converter acquires a representative analog signal (a "sample") and compares that sampled signal to a reference level in order to quantize the sampled signal into the digital domain. For example, a sampled analog input signal may be compared in succession to multiple different voltage levels which are based in part on the reference level. The outcome of these comparisons is used to create a digital word which represents the digital value of the sampled analog signal. Such converters are known in the art as Successive Approximation Register converters (SARs).

One popular type of SAR is the charge redistribution SAR which uses a charge-scaling digital-to-analog converter (DAC) to sum the sampled analog input signal with preset fractions of the reference level. This is typically implemented using an array of individually switched, binary-weighted capacitors which combine to produce the preset fractions of the reference level. The sum of the input signal and the preset fractions of the reference level are successively compared to a preset level (e.g., ground) to produce comparison bits until the resolution limit of the converter is reached.

In order for the ADC described above to operate with the desired precision, its capacitors must be properly proportioned with respect to one another or conversion errors occur. The ADC relies on precise proportioning ratios in order to produce the preset fractions of the reference level with sufficient accuracy to ensure meaningful and accurate conversion of the sampled analog input signal. For example, in many ADCs it is common for comparison capacitors to be connected with one common terminal and arranged in descending order, with each subsequent capacitor having a value of half of the preceding larger capacitor. Each capacitor typically has a unique terminal that is selectively connected to one of two terminals of a reference level source and forms a voltage divider with the other comparison capacitors.

This causes a preset fraction of the reference level to develop on the common terminal of the comparison capacitors, which is summed with the sampled analog input signal. The common terminal of the comparison capacitors is then connected to a comparator which provides a digital output based on the comparison of the summed value to the known value.

Nevertheless, when capacitor values vary due to imprecision associated with manufacturing tolerances, the voltage divider ratios are adversely affected, introducing errors in the preset fractions of the reference level. This, in turn, introduces errors in the digital quantization process.

In view of this known problem, numerous schemes have been proposed that correct this conversion error. One known solution involves the use of trim tables that compensate for errors or "mismatches" in comparison capacitors during the conversion process. This is generally accomplished by providing a trim table that includes compensation values which are added to, or subtracted from, the summed voltage to correct for any errors in the applied fractional reference level due to capacitance mismatch (i.e. to compensate for the incorrect amount of charge provided by the improperly proportioned capacitors).

Such trim tables are populated with values that may be determined during a calibration phase and are based on comparisons of the generated digital representations, which are converted back to analog, with the original sampled analog input signal. This approach requires the use of another dedicated DAC circuit, such as a sub-DAC, that converts the digital trim table entries back to the analog domain for subsequent combination with the summed signal during the conversion process to provide the compensation necessary to correct for capacitor imprecision.

This type of architecture, however, suffers from several drawbacks. For example, the dedicated DAC circuit of these prior art systems are exposed to processing gradients, package stress and other factors which may differ significantly from those of the primary measurement DAC, which may introduce correction factor errors. Additionally, valuable die space must be devoted to the dedicated DAC, which has no purpose other than to perform the calibration function.

Furthermore, in such systems, the application of one or more trim table correction factors occurs during the actual analog to digital conversion process itself. That is, every time a bit is tested against the sampled analog input signal, the dedicated DAC provides charge that adjusts the weight of the bit under test to the desired weight. Thus, the dedicated DAC is perpetually active during the conversion, constantly switching charge in and out for every bit test. This type of calibration during conversion may be referred to as "in-the-loop" calibration.

The constant capacitive switching associated with this in-the-loop calibration approach introduces noise in the system, adversely affecting the analog portions of the circuit, and undesirably imposes a significant switching load on the reference source, both of which may degrade circuit performance.

Thus, in view of the foregoing, it would be desirable to provide systems and methods that overcome these and other drawbacks of the prior art.

SUMMARY OF THE INVENTION

Circuits and methods for determining component ratios are provided. An analog to digital converter circuit may include comparison capacitors arranged in an upper group and a lower group for quantizing analog signals into the digital domain. In addition to determining the lower bits during an analog to digital conversion of an input sample, the lower group of comparison capacitors may also be used to measure the residual signals that represent the capacitor mismatches of the upper group rather than using a dedicated digital-to-analog converter to perform this function.

In one embodiment of the present invention, a method for deriving a representation of a ratio characterizing a plurality of elements is provided which includes providing a subset of elements selected from the plurality of elements, the subset of elements having substantially known ratios, providing an element from the plurality of elements that is not part of the subset that affects the ratio, producing a signal characterizing the ratio using the element and the subset of elements of the plurality; and deriving the representation using the subset of elements.

In another embodiment of the present invention, an electronic circuit that generates a signal which represents a proportionality of circuit components is provided, including a plurality of circuit components for processing an input signal having a first sub-plurality and a second sub-plurality, wherein the proportionality of components in the second sub-plurality is substantially known; and wherein at least one component in the first sub-plurality is compared to at least the second sub-plurality of components such that the second sub-plurality of components generates a digital ratio signal representing the proportionality of the at least one component in the first plurality with respect to at least the second sub-plurality of components.

In another embodiment of the present invention, an analog to digital conversion circuit that operates in a conversion mode and in a calibration mode is provided, including a plurality of approximation capacitors for converting an analog input signal into a digital signal in the conversion mode, the plurality of successive approximation capacitors including an upper group of capacitors and a lower group of capacitors, a plurality of switches for selectively connecting the plurality of successive approximation capacitors to a first reference level and second reference level, wherein during the calibration mode at least one capacitor in the upper group is compared to at least the capacitors in the lower group such that the lower group of capacitors generates a digital ratio signal representing the proportionality of the at least one capacitor in upper group to at least the lower group of capacitors.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
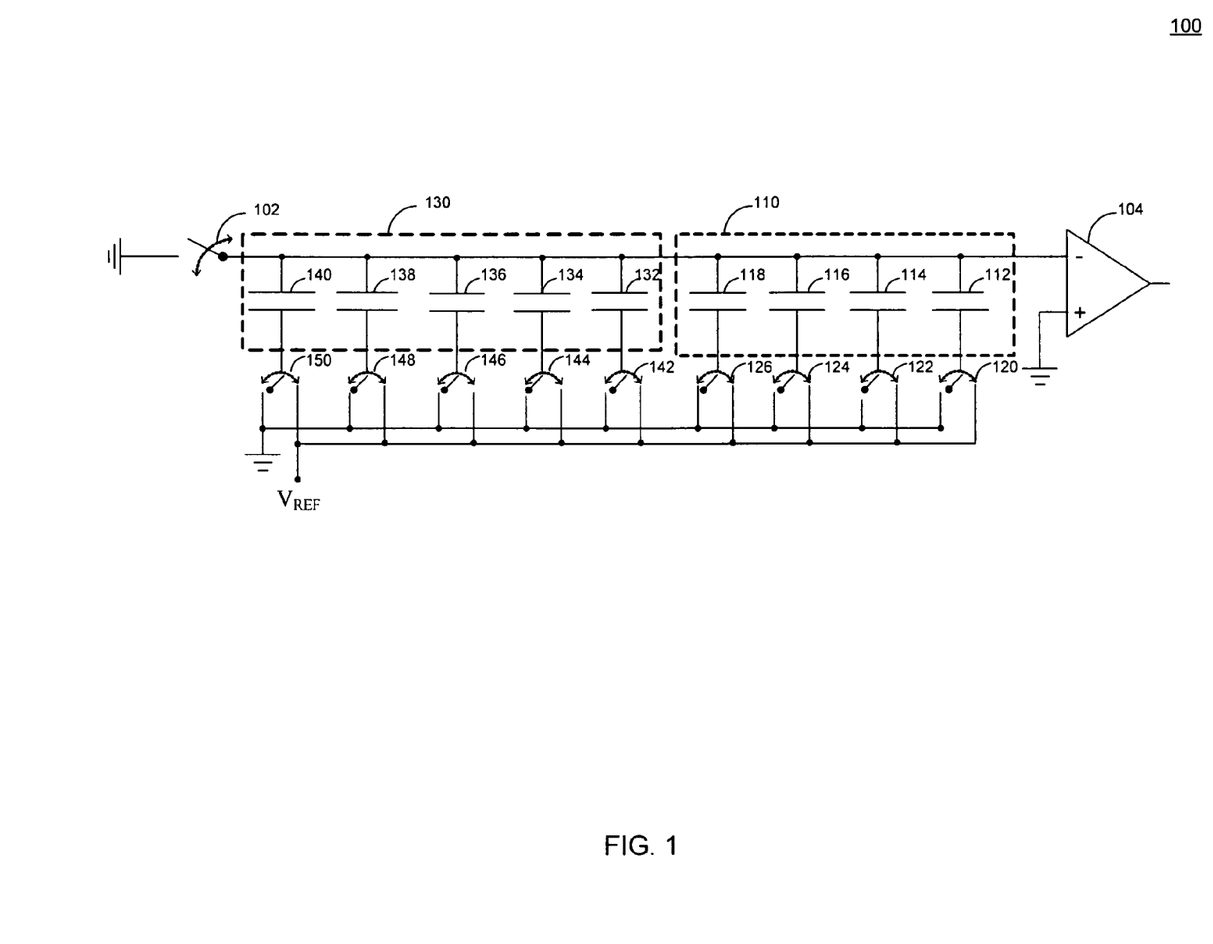
FIG. 1 is a general schematic diagram of a portion of a circuit that may be used to generate a signal that characterizes component ratios in accordance with an illustrative embodiment of the present invention.

FIG. 1 shows a schematic diagram of one exemplary embodiment of a circuit 100 for generating a signal that characterizes component ratios in accordance with one aspect of the present invention. Although the following specific embodiments herein relate to the generation of a signal representing component ratios, and in particular capacitive ratios among a group of certain parallel connected capacitors, it will be understood that these specific embodiments are offered to illustrate the present invention, and not serve as limitations. The novel principles expressed herein may be applied to other circuit arrangements, such as determining ratios of other components in any suitable resistive or reactive network, if desired.

As illustrated, circuit 100 generally includes switch 102, comparator circuit 104, comparison capacitors 112, 114, 116, 118, 132, 134, 136, 138 and 140, and switches 120, 122, 124, 126, 142, 144, 146, 148, 150. The comparison capacitors may be separated into two groups, an upper group 110 and a lower group 130. Capacitors 112, 114, 116 and 118 may be assigned to upper group 110 with capacitors 132, 134, 136, 138 and 140 assigned to lower group 130 (illustrated by the dashed lines).

In some embodiments, circuit 100 may be embedded in an analog to digital converter circuit (ADC) that uses binary weighted capacitors to implement a capacitive digital-to-analog converter (DAC). Accordingly, the capacitors in group 110 may represent the most significant bits (MSBs) in a capacitive DAC whereas the capacitors in group 130 may represent the least significant bits (LSBs).

Other portions of known ADC circuitry, such as a successive-approximation register, and control circuitry for governing the operation of circuit 100 as further described herein have been omitted for clarity. Furthermore, it will be understood that the total number of capacitors and the assignment of any particular capacitor to upper group 110 or lower group 130 may vary depending on numerous factors such as capacitor size or the intended resolution of a given ADC, number of comparison capacitors provided, manufacturing tolerances, etc.

Circuit 100 may operate generally as follows. Initially, it may be assumed that the capacitors in upper group 110 vary somewhat from their design values, and are thus "mismatched" with respect to their intended ratios with other capacitors in circuit 100. On the other hand, the capacitors in lower group 130 are assumed sufficiently close enough to their intended values (i.e., are "well matched") to accurately produce the relatively small voltage increments they are intended to represent.

Accordingly, the capacitors in upper group 110 may be considered as requiring calibration, whereas the capacitors in lower group 130 may be considered as not requiring calibration. The assignment of certain capacitors to group 110 or 130 may vary depending on this assumption. For example, if it is determined (or assumed) that more capacitors require calibration, based on, for example, known variation statistics associated with a certain manufacturing process, the number of capacitors in group 110 may be increased and the number in group 130 decreased (and vice versa). The assignment of capacitors to group 110 or 130 may also be determined by comparison to one another rather than by assumption (discussed in more detail below).

Generally speaking, in some embodiments, circuit 100 may be deployed as part of an ADC circuit and have two (or more) modes of operation. A first mode of operation of circuit 100 may be considered a "calibration" mode and second mode of operation may be considered a "conversion" mode. During the calibration mode, capacitor mismatches in upper group 110 are determined by comparing capacitors in that group to capacitors in lower group 130 and generating a "ratio signal" which is indicative of the mismatch. The ratio signal may then be quantized by the capacitors in group 130 and used as a basis to generate correction factors, which compensate for variations in capacitor size in upper group 110 during the conversion mode (discussed in more detail below). This quantized ratio signal may be referred to herein as a "digital ratio signal."

After calibration is complete, the capacitors in both groups 110 and 130 are used during the conversion mode to quantize an analog input signal. Such conversion may be accomplished using known techniques (e.g., by generating a residual signal and quantizing it using known successive approximation techniques). Thus, in accordance with one aspect of the present invention, substantially the same capacitors used during calibration to generate the ratio signal are used to quantize an analog input signal while operating in the conversion mode. Accordingly, it will be understood that the conversion mode and the calibration mode are typically substantially mutually exclusive of one another such that circuit 100 is either in the calibration mode or in the conversion mode. Thus, the ratio signal and any associated correction factors are typically not generated during the conversion mode and vice versa.

Additionally, it will be further understood that the calibration of upper group 110 may occur periodically (or at the time of fabrication). For example, upper group 110 may be calibrated each time circuit 100 is powered up such that new correction factors are continually generated throughout its lifespan. Furthermore, in applications where circuit 100 is in conversion mode for long periods of time, calibration may occur periodically to ensure accuracy. Such calibration may be initiated based on an external signal or may occur unprompted by internal control circuitry (not shown) after a certain number of conversions have been performed, after a certain period of ON time has elapsed, etc.

More specifically, in calibration mode, capacitor ratios in upper group 110 may be determined by generating a ratio signal characterizing the component ratio based on a reference level for each of the capacitors in upper group 110. One way this may be accomplished is by sequentially applying a reference level to each capacitor in group 110, and connecting the remaining capacitors to ground. This creates a voltage divider among the capacitors such that a fraction of the reference level is stored on the non-grounded capacitor that is directly proportional to its capacitance. This voltage may be compared with a sum of the voltages stored on the remaining capacitors. If the two values are equal, the sum will be zero and indicate that the capacitors are matched (i.e., each have a substantially equal capacitance value). If the comparison produces a non-zero ratio signal (i.e., either positive or negative value), that ratio signal is proportional to the mismatch. The ratio signal may then be quantized using the capacitors in lower group 130 to generate a digital ratio signal.

Thus, for example, if the capacitance value of capacitor 112 is equal to the sum of the capacitance of the remaining capacitors in groups 110 and 130, the applied reference level will be divided evenly between capacitor 112 and the remaining capacitors. If the two capacitances are not equal, more charge will be stored on the component(s) having the greater capacitance.

Accordingly, if a comparison produces a non-zero ratio signal, this signal may be subsequently quantized with the capacitors in lower group 130 and used as the basis for creating a correction factor to be associated with capacitor 112. This value may be stored as an entry in a trim table for calibrating an ADC.

Thus, in one embodiment, if capacitor 112 is greater in capacity than the sum of the remaining capacitors in group 110 and the capacitors in group 130, the ratio signal will be positive, if its capacity is smaller, the ratio signal will be negative.

This process may be repeated for each capacitor in upper group 110 until calibration values for all those capacitors are obtained. For example, capacitor 114 may be measured by coupling it to the reference level and grounding the remaining capacitors. If the capacitance value of capacitor 114 is substantially equal to the sum of the capacitance of the remaining capacitors in groups 110 and 130, the applied reference level will be divided substantially evenly between capacitor 114 and the remaining capacitors (excluding capacitor 112, which is inactive for this measurement).

If the two capacitances are not equal, more charge will be stored on the component(s) having the greater capacitance. Accordingly, if a comparison produces a non-zero ratio signal, this signal may be subsequently quantized using the capacitors in lower group 130 and used as the basis for creating a correction factor (which may be stored as an entry in a trim table for calibrating an ADC). This process may be repeated for capacitors 116 and 118 until all the capacitors in upper group 110 have been measured.

It will be understood that each time a ratio signal is obtained for a particular capacitor in upper group 110, that particular capacitor and any preceding capacitors are preferably excluded from further comparisons to take advantage of the binary weighted construction of circuit 100. For example, generally speaking, circuit 100 is constructed such that each subsequent capacitor is intended to be substantially equal to the sum of all of its following capacitors. Thus, the capacitance of capacitor 118 is intended to be equal to the sum of capacitors 132, 134, 136 and 138, the capacitance of capacitor 116 is intended to equal the sum of capacitors 118, 132, 134, 136 and 138, etc.

Accordingly, when measuring a certain capacitor in upper group 110, any preceding larger capacitor(s) are excluded. In some embodiments, this binary summation property may require an additional LSB capacitor, such as a capacitor substantially equal to the value of capacitor 138 in order to provide a "termination capacitor" that completes the series (which is illustrated as capacitor 140 in FIG. 1).

As mentioned above, after a ratio signal has been obtained for a capacitor in upper group 110, it may be quantized with the capacitors in lower group 130 using known successive approximation techniques to generate a digital ratio signal.

Capacitors from group 130 may then be successively switched to $V_{REF}$ until the stored voltage is returned to a preset value (e.g., ground). This may be done using a successive approximation register coupled to the output of comparator 104 and lower group 130 (not shown).

In some embodiments, it is assumed that the ratio signal produced by any of the capacitors in upper group 110 will not exceed a value which is greater than the sum of the capacitors in lower group 130 (i.e., will not exceed the range of lower group 130). However, this condition may occur periodically, in which case the two groups 110 and 130 can be redefined such that group 110 incorporates some of the larger capacitors in group 130.

In some embodiments, lower group 130 cannot measure a positive ratio signal because it can only add positive charge during the successive quantization process. In such embodiments, a negative fixed offset value may be added to the ratio signal substantially equal to the range of lower group 130 to ensure that the ratio signal remains a negative value. The presence of a positive ratio signal value may be detected by comparator 104, at which point a negative offset capacitor (not shown) is switched into the lower group 130. This capacitor may be substantially twice the size of capacitor 132 (and thus substantially equal to capacitor 118). After the new capacitor is added, the ratio signal is generated again. If it is negative, the quantization process continues. If it is still positive, an error signal may be generated. In some embodiments, additional capacitors may continue to be added until a negative ratio signal is obtained.

In addition, as mentioned above, the grouping of certain capacitors in upper group 110 or lower group 130 may be based on assumptions regarding the accuracy of certain LSB capacitors. In some embodiments, however, capacitors in circuit 100 may be assigned to group 130 based on their capacity and/or comparison with other capacitors. For example, in one embodiment, only the two smallest LSB capacitors are assumed to be in group 130 initially. These capacitors are compared with the third smallest LSB capacitor as described above. If the comparison produces a substantially zero ratio signal, this capacitor is added to group 130. If not, it is assigned to group 110. This process may be repeated in an ascending fashion until a non-zero ratio signal is obtained. The first capacitor to produce a non-zero ratio signal is assigned to upper group 110. Once a non-zero ratio signal is obtained, all other larger value capacitors in circuit 100 are automatically assigned to group 110.

In other embodiments, capacitors of a certain size or larger may be automatically assigned to upper group 110 (irrespective of the outcome of the comparison). As with the calibration process described above, capacitors may be selectively assigned to group 130 or group 110 at fabrication, periodically, or prior to operating in the calibration mode.

One benefit of this approach is that it may reduce the number of capacitors assigned to group 110, thereby streamlining the calibration process. Another benefit is that imprecision in smaller capacitors may be detected, improving the overall quality of the calibration process, and thus improving the accuracy of any ADC.

Figure 2:
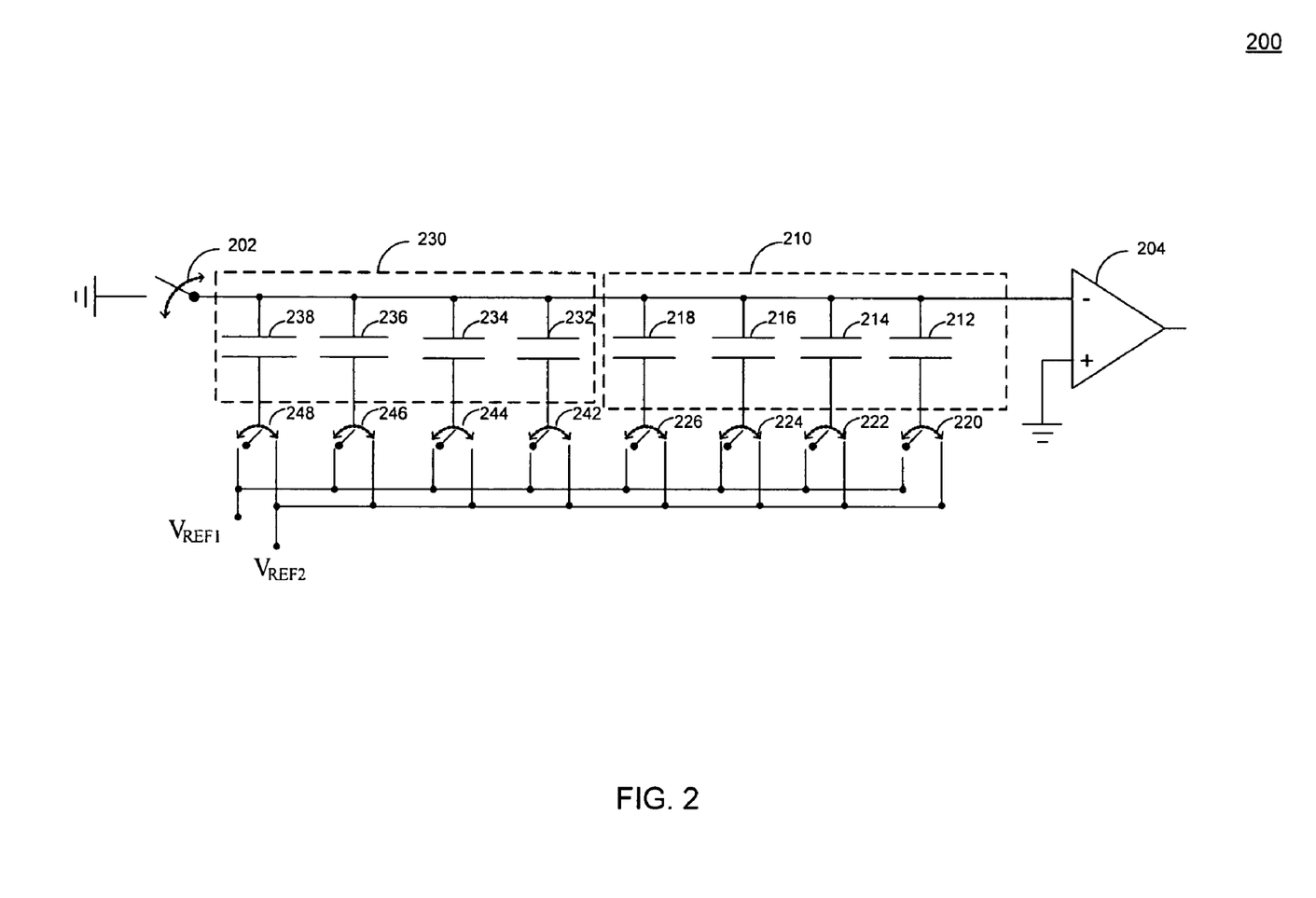
FIG. 2 is a schematic diagram of a portion of a circuit that may be used to generate a signal that characterizes component ratios in accordance with an illustrative embodiment of the present invention.

A schematic diagram of another embodiment of the present invention for generating a ratio signal that characterizes component ratios in accordance with another aspect of the present invention is shown in FIG. 2. Circuit 200 is similar in many respects to circuit 100 and includes similarly numbered components to denote general correspondence. For example, circuit 200 generally includes switch 202, comparator circuit 204, comparison capacitors 212, 214, 216, 218, 232, 234, 236 and 238, and switches 220, 222, 224, 226, 242, 244, 246 and 248.

As in FIG. 1, the comparison capacitors may be separated into two groups, upper group 210 and lower group 230 (denoted by the dashed lines). Capacitors 212, 214, 216 and 218 may be assigned to upper group 210, with capacitors 232, 234, 236, and 238 assigned to lower group 230. Circuit 200 operates in substantially the same manner as described above in connection with circuit 100.

Circuit 200, however, differs from circuit 100 in two notable respects. First, circuit 200 has removed the termination capacitor (capacitor 140 in FIG. 1) from lower group 230. This changes the sum of the capacitors in group 230 such that the sum is now less than the value of capacitor 218 by the value of that termination capacitance.

In order to account for this difference, capacitor 232 may be constructed such that it is substantially equal to the value of capacitor 218 and be referred to as an "offset capacitor." Capacitor 234 may be constructed such that it is half the value of 232, etc. As a result, any ratio signal (or digital ratio signal) generated by circuit 200 will include an offset which is substantially equal to the value of the missing termination capacitor and offset capacitor 232. This known offset can be taken into account during any subsequent quantization function during a calibration routine as described above. One benefit of this configuration is that it reduces the number of capacitors in the lower group.

In addition, circuit 200 has been modified such that it generates a ratio signal representing a component ratio based on two references signals ($V_{REF1}$ and $V_{REF2}$) rather than based on one reference level and ground. This allows circuit 200 to generate output signals with respect to two selectable potentials rather than one selectable potential and ground.

Figure 3:
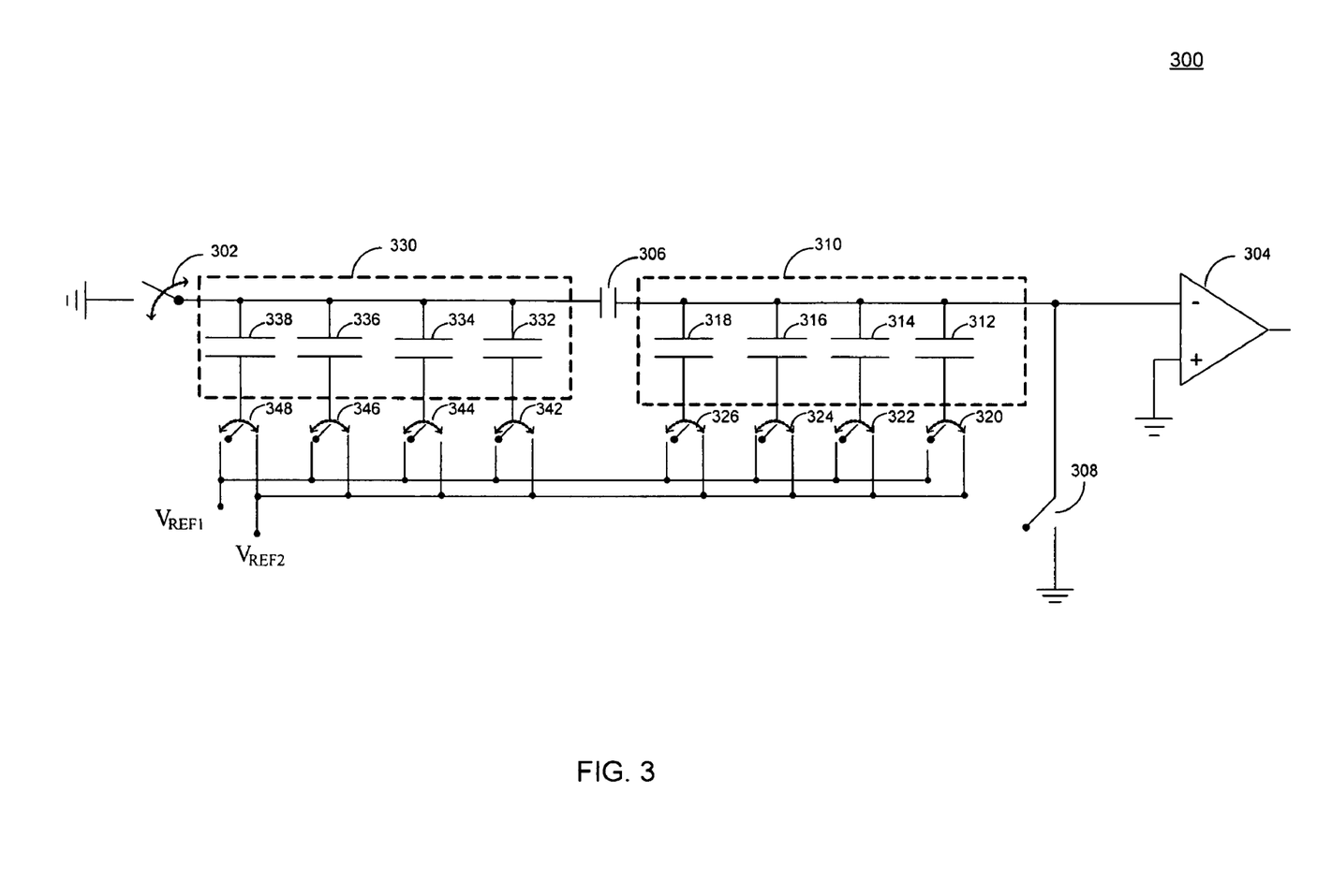
FIG. 3 is a schematic diagram of a portion of a circuit that may be used to generate a signal that characterizes component ratios in accordance with an illustrative embodiment of the present invention.

A further improvement of the circuit in FIG. 2 is illustrated in FIG. 3 as circuit 300. As in FIG. 2, the comparison capacitors may be separated into two groups, upper group 310 and lower group 330 (denoted by the dashed lines). Capacitors 312, 314, 316 and 318 may be assigned to upper group 310, with capacitors 332, 334, 336, and 338 assigned to lower group 330. Circuit 300 further includes coupling capacitor 306, switches 302 and 308, and comparator circuit 304.

Circuit 300 operates in substantially the same manner as described above in connection with circuits 100 and 200. However, coupling capacitor 306 may act a multiplier in this embodiment, which allows the capacitors in lower group 330 to be reduced in size.

Moreover, because the common terminal of upper group 310 is now floating with respect to DC voltages (due to the addition of coupling capacitor 306), switch 308 is added which serves substantially the same purpose as switch 302 and operates in phase with switch 302. This improvement may be added to any single ended or differential embodiment of the invention.

Figure 4:
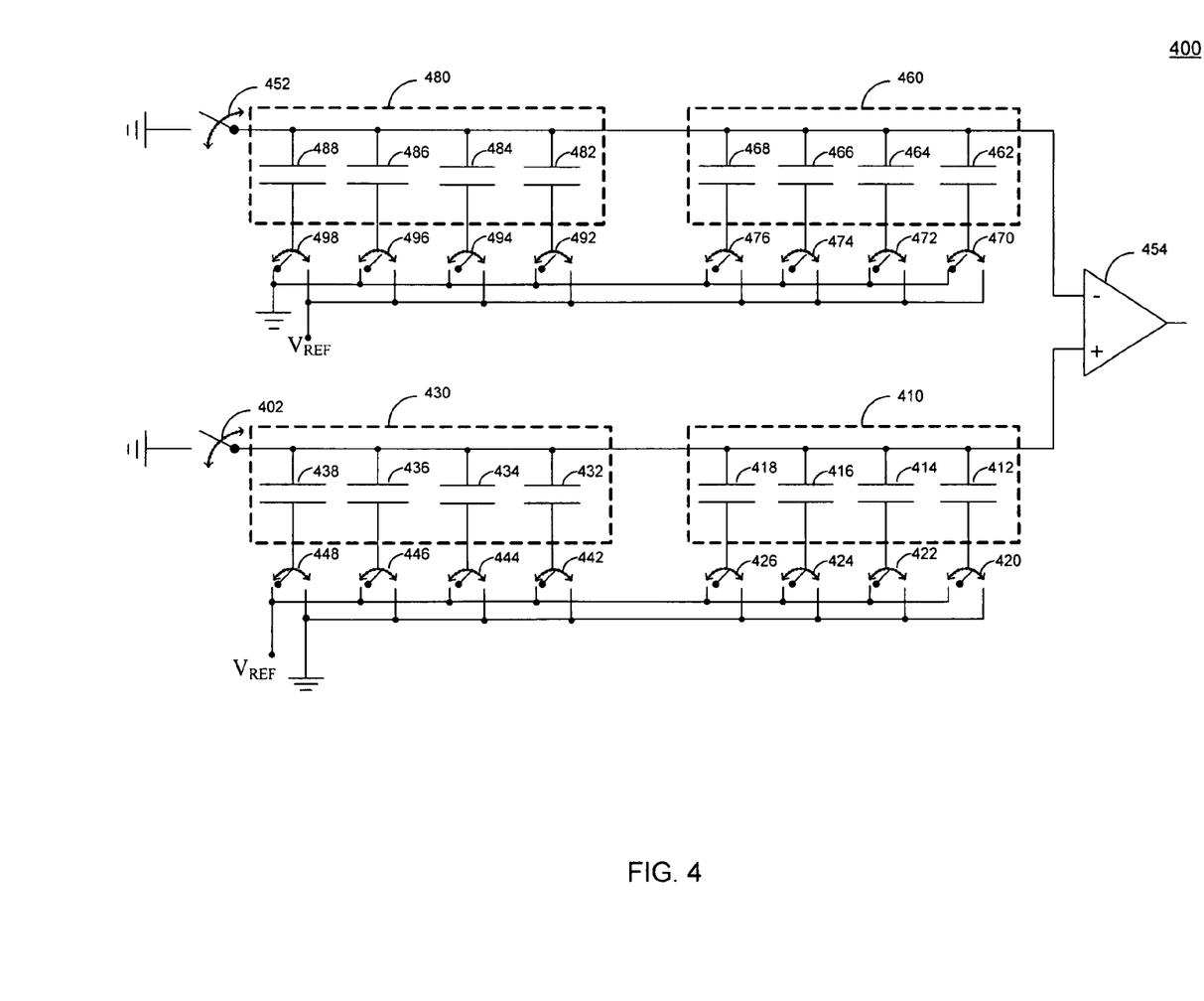
FIG. 4 is a schematic diagram of a portion of a circuit that may be used to generate a signal that characterizes component ratios in accordance with an illustrative embodiment of the present invention.

A schematic diagram of another embodiment of the present invention for generating a ratio signal that characterizes component ratios is shown in FIG. 4. Circuit 400 is similar in some respects to circuits 100, 200 and 300 and includes similarly numbered components to denote general correspondence. For example, circuit 400 generally includes switch 402, comparator circuit 454, comparison capacitors 412, 414, 416, 418, 432, 434, 436 and 438, and switches 420, 422, 424, 426, 442, 444, 446, and 448.

As shown, circuit 400 also includes an additional capacitor bank, which may be a substantial copy of the circuit described above and generally includes switch 452, comparison capacitors 462, 464, 466, 468, 482, 484, 486 and 488, and switches 470, 472, 474, 476, 492, 494, 496, and 498.

As in FIGS. 1-3, the comparison capacitors may be separated into two groups, upper groups 410 and 460, and lower groups 430 and 480 (denoted by the dashed lines). Capacitors 412, 414, 416 and 418 may be assigned to upper group 410 and capacitors 462, 464, 466, and 468 assigned to upper group 460, with capacitors 432, 434, 436, and 438 assigned to lower group 430 and capacitors 482, 484, 486 and 488 assigned to lower group 480. Circuit 400 may be embedded in an ADC circuit using binary weighted capacitors to implement a capacitive DAC.

Accordingly, the capacitors in groups 410 and 460 may represent the most significant bits (MSBs) in the ADC whereas the capacitors in groups 430 and 480 may represent the least significant bits (LSBs). Other portions of known ADC circuitry have been omitted for clarity. Furthermore, it will be understood that the total number of capacitors and the assignment of any particular capacitor to the upper or lower group may vary depending on numerous factors such as capacitor size, the intended resolution, or number of capacitors of a given ADC or may be assigned selectively as described above.

Circuit 400 may operate generally as follows. Initially, it may be assumed that only the capacitors in upper groups 410 and 460 have unknown ratios and that the capacitors in lower groups 430 and 480 have substantially known ratios. Accordingly, the capacitors in upper groups 410 and 460 may be considered as requiring calibration, whereas the capacitors in lower group 430 and 480 may be considered as not requiring calibration.

Initially, circuit 400 may operate similarly to circuit 100 and have only one active capacitor bank to obtain a ratio signal (either 410 and 430 or 460 and 480). For example, assume capacitor banks 410 and 430 are active. In this case, circuit 400 operates to generate a ratio signal that characterizes the ratios of capacitors 412, 414, 416 and 418. At first, a ratio signal characterizing the ratio of capacitor 412 is generated. Next, the sign of that ratio signal is determined by comparator 454 (i.e., positive or negative). This information is used by the opposing lower group 480 to set its initial conditions, so it may be used to quantize the ratio signal in parallel rather than reusing the capacitors in lower group 430 to perform this operation. The resulting quantized signal is a digital representation of the ratio signal for capacitor 412.

One benefit of this arrangement is that because the lower group 480 can measure both signs of the ratio signal, no large offset voltages are required. Consequently small ratio signals may be offset by a corresponding small amount of charge. As a result of the smaller amounts of charge, the capacitor matching requirement within the lower groups 430 and 480 is less stringent.

If the sign of the ratio signal from upper group 410 is determined to be negative, the capacitors in lower group 480 are connected to ground, and the ratio signal generation process is repeated. In this case, the negative ratio signal can be quantized by the lower group 480 because it is connected to the inverting terminal of comparator 454.

Conversely, if the sign of the ratio signal from upper group 410 is determined to be positive, the capacitors in lower group 480 are connected to the reference, and the ratio signal generation process is repeated. In this case, the positive ratio signal is also quantized by group 480. This process is repeated for each of the capacitors in upper group 410.

If capacitor groups 460 and 480 are also used by circuit 400 to implement a differential analog to digital converter, the capacitor ratios of group 460 also need to be quantized in the same manner as above. However, in this case, lower group 430 is now used to generate the ratio signals for upper group 460.

Furthermore, variations of circuit 400 may be constructed such that it generates a ratio signal based on two references levels ($V_{REF1}$ and $V_{REF2}$) rather than based on one reference level and ground (not shown). This variation allows the generation of output signals with respect to two selectable potentials rather than one selectable potential and ground allowing circuit 400 to accommodate a broader range of ratio signals.

Figure 5:
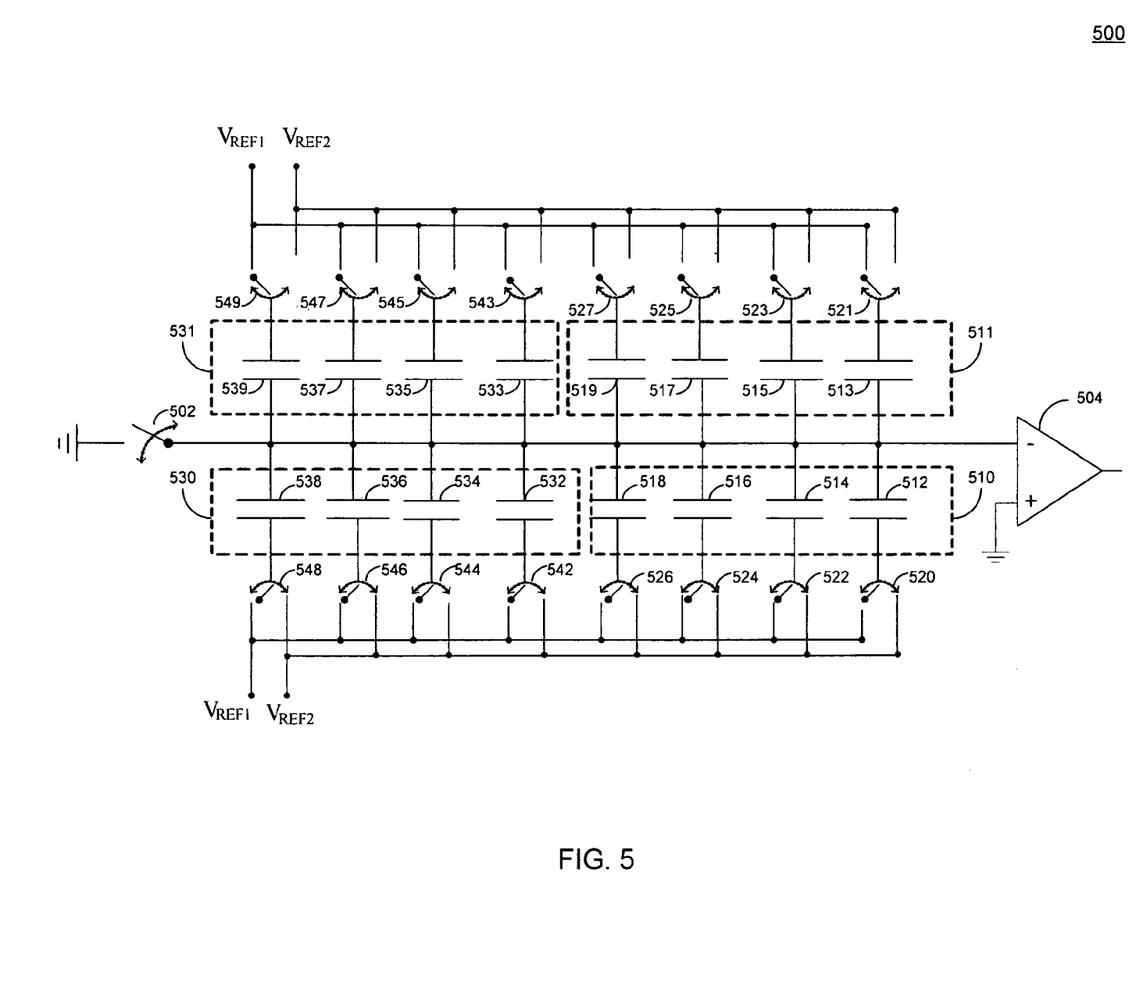
FIG. 5 is a schematic diagram of a portion of a circuit that may be used to generate a signal that characterizes component ratios in accordance with an illustrative embodiment of the present invention.

Another embodiment constructed in accordance with the principles of the present invention is shown in FIG. 5 as circuit 500. Generally speaking, circuit 500 is a "split-DAC" embodiment of circuit 200 shown in FIG. 2. That is, each of the capacitors in circuit 200 have been divided in half and coupled to each other and to the respective reference levels through additional switches such that they are synchronously coupled to the same reference level.

For example, capacitors in lower groups 530 and 531 and upper groups 510 and 511 are each substantially half the value of the corresponding capacitors in group 210 in 230 in FIG. 2. Thus, in particular, capacitors 538 and 539 are substantially half the value of and correspond to capacitor 238. Similarly, capacitors 536 and 537 are substantially half the value of and correspond to capacitor 236, capacitors 534 and 535 are substantially half the value of and correspond to capacitor 234, capacitors 532 and 533 are substantially half the value of and correspond to capacitor 232, capacitors 518 and 519 are substantially half the value of and correspond to capacitor 218, capacitors 516 and 517 are substantially half the value of and correspond to capacitor 216, capacitors 514 and 515 are substantially half the value of and correspond to capacitor 214, and capacitors 512 and 513 are substantially half the value of and correspond to capacitor 212.

Moreover, switches 542 and 543 correspond to switch 242. Similarly, switches 544 and 545 correspond to switch 244, switches 546 and 547 correspond to switch 246, switches 548 and 549 correspond to switch 248, switches 520 and 521 correspond to switch 220, switches 522 and 523 correspond to switch 222, switches 524 and 525 correspond to switch 224, and switches 526 and 527 correspond to switch 226. Furthermore, $V_{REF2}$ is assumed to be greater than $V_{REF1}$.

During operation, each of the capacitor pairs functions uniformly as a single capacitor and thus circuit 500 may operate similar to or substantially the same as circuit 200 above. For example, a ratio signal characterizing the ratio of the MSB capacitor in circuit 500 (capacitor pair 512 and 513) may be generated by comparing the charge on that capacitor pair to the sum of charges on all the remaining capacitors in groups 510, 511, 530 and 531 and quantizing the ratio signal. As discussed above, this process may continue in a descending order excluding the capacitor pairs previously examined using successive approximation techniques until all capacitors pairs in groups 510 and 511 have been characterized.

However, rather than using a standard binary search technique to generate the digital ratio signal (as in FIG. 2), a split-DAC algorithm may be used to derive the digital ratio signal as follows.

Initially, a ratio signal representing a component ratio is produced as described above, with lower capacitor groups 630 and 631 being used subsequently to derive the digital representation of this signal (i.e., the digital ratio signal). The first step in the derivation process is to compare the ratio signal against a half-range configuration of the lower capacitor groups to determine its relative magnitude (a mid-scale test). For example, a mid-scale comparison signal may be generated in group 530 by connecting capacitors 534, 536 and 538 to $V_{REF2}$ from $V_{REF1}$ with all other capacitors in lower groups 530 and 531 remaining connected to $V_{REF1}$. Comparator 504 determines whether the ratio signal is larger or smaller than the mid-scale comparison signal.

If the comparator determines that the ratio signal is larger than the mid-scale signal, the ratio signal is compared to a three-quarter scale value by connecting capacitor 535 to $V_{REF2}$ from $V_{REF1}$. However, if the comparator determines that the ratio signal is smaller than the mid-scale signal, the ratio signal is compared to a quarter-scale value by connecting capacitor 534 back to $V_{REF1}$. This process may be repeated for all capacitors in the lower group until a final digital representation of the ratio is obtained.

More particularly, in one embodiment, the split-DAC algorithm may operate as follows. Initially, switch 502 is closed coupling the inverting terminal of comparator 504 and the common terminal of the capacitors to ground. Switches 542-549 then couple the capacitors in lower groups 530 and 531 to $V_{REF2}$, charging them to that voltage level. Similarly, capacitors 514-519 in groups 510 and 511 are charged to $V_{REF2}$ level by coupling them to $V_{REF2}$ through switches 522-527. However, capacitors 512 and 513, representing the MSB of circuit 500, are charged to $V_{REF1}$, which is smaller than $V_{REF2}$, by connecting them to $V_{REF1}$ through switches 520 and 521.

Next, switch 502 is turned OFF, disconnecting the common terminal of the capacitors from ground. Switches 542-549 then couple the capacitors in lower groups 530 and 531 to $V_{REF1}$, and capacitors 514-519 are coupled to $V_{REF1}$ by switches 522-527. In addition, capacitors 512 and 513 are coupled to $V_{REF2}$ through switches 520 and 521. At this point, a ratio signal representing the ratio of capacitors 512 and 513 to the rest of the capacitors in circuit 500 is present at the inverting input of comparator 504.

Assuming this signal is negative, the mid-scale test described above is performed. That is, switches 544, 546 and 548 couple capacitors 534, 536 and 538 to $V_{REF2}$. The other capacitors remain connected as described above. If the voltage at the inverting input of comparator 504 is positive, indicating the ratio signal is larger than the mid-scale level, switch 546 connects capacitor 536 back to $V_{REF1}$ and the quarter scale test is performed.

If the quarter-scale test results in a negative signal at the inverting terminal of comparator 504, switch 547 connects capacitor 537 to $V_{REF2}$ and the three-eighths-scale test is performed. This split-DAC process repeats itself for the remaining LSB capacitors in groups 530 and 531. The final result is a digital signal that represents the ratio of the MSB capacitors in groups 510 and 511 to the remaining capacitors in circuit 500.

This entire process is then repeated for all the remaining MSB capacitor pairs in groups 510 and 511 (i.e., capacitors 514 and 515, 516 and 517, and 518 and 519) to obtain digital ratio signals for each MSB capacitor in circuit 500. These digital ratio signals may be used to calculate correction factors which may be stored in a trim table in an analog to digital converter as further described in FIG. 7 below.

Figure 6:
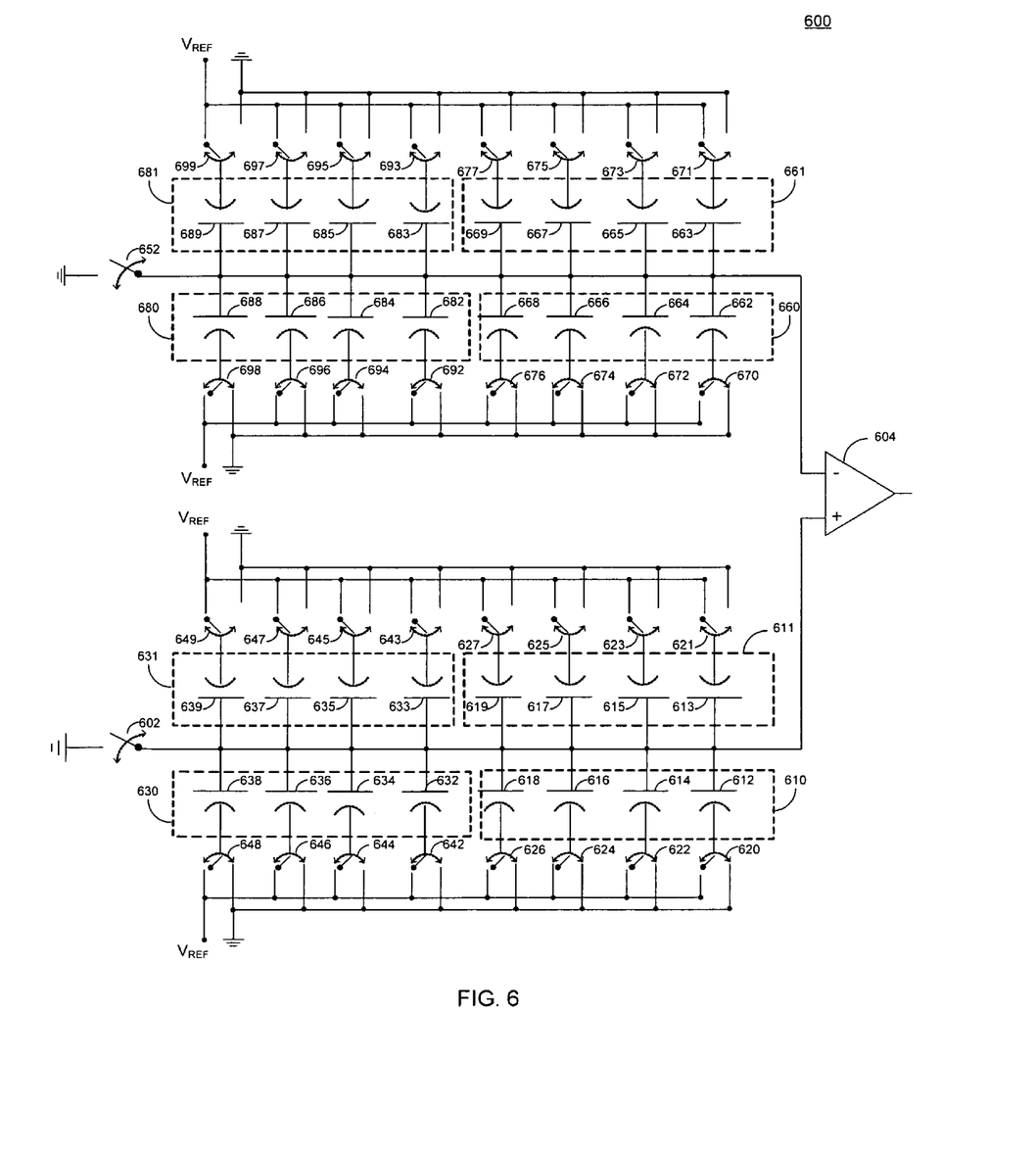
FIG. 6 is a schematic diagram of a portion of a circuit that may be used to generate a signal that characterizes component ratios in accordance with an illustrative embodiment of the present invention.

Another embodiment constructed in accordance with the principles of the present invention is shown in FIG. 6 as circuit 600. Generally speaking, circuit 600 is a split-DAC embodiment of circuit 400 shown in FIG. 4. That is, each of the capacitors in circuit 400 have been divided in half and coupled to each other and to the respective reference levels through additional switches such that they are synchronously coupled to the same reference level.

For example, capacitors in upper groups 410 and 460 have been split into upper groups 610 and 611, and 660 and 661, respectively. Likewise, lower groups 430 and 480 have been split into lower groups 630 and 631, and 680 and 681, respectively. Upper groups 610 and 611 include capacitors 612-619 and switches 620-627 as shown in FIG. 6. Similarly, upper groups 660 and 661 include capacitors 662-669 and switches 672-679 as shown. Lower groups 630 and 631 include capacitors 632-639 and switches 640-647 a shown. Similarly, lower groups 680 and 681 include capacitors 682-689 and switches 692-699 as shown.

Each of the capacitors in lower groups 630, 631, 680 and 681 and upper groups 610, 611, 660 and 661 are each substantially half the value of the corresponding capacitors in groups 410, 430, 460, and 480 in FIG. 4.

Initially, circuit 600 may operate similarly to circuit 400 and have only one active capacitor bank to obtain a ratio signal (either 610, 611, 630 and 631, or 660, 661, 680 and 681). For example, assume capacitor banks 610, 611, 630 and 631 are active. In this case, circuit 600 generates a ratio signal that characterizes the ratios of capacitors 612-619.

At first, a ratio signal characterizing the ratio of the MSB capacitor pair 612 and 613 is generated. Next, the sign of that ratio signal is determined by comparator 604 (i.e., positive or negative). This information is used by the opposing lower groups 680 and 681 to set its initial conditions, so it may be used to quantize the ratio signal in parallel rather than reusing the capacitors in lower groups 630 and 631 to perform this operation. The resulting quantized signal is a digital representation of the ratio signal for the MSB capacitor pair 612 and 613.

One benefit of this arrangement is that because the lower groups 680 and 681 can measure both signs of the ratio signal, no large offset voltages are required. Consequently small signals may be offset by a corresponding small amount of charge. As a result of the smaller amounts of charge, the capacitor matching requirement within the lower groups 630, 631, 680 and 681 is less stringent.

If the sign of the ratio signal from upper groups 610 and 611 is determined to be negative, the capacitors in lower group 680 and 681 are connected to ground, and the ratio signal generation process is repeated. In this case, the negative ratio signal can be quantized by lower groups 680 and 681 because it is connected to the inverting terminal of comparator 604.

Conversely, if the sign of the ratio signal from upper groups 610 and 611 is determined to be positive, the capacitors in lower groups 680 and 681 are connected to the reference, and the ratio signal generation process is repeated. In this case, the positive ratio signal is also quantized by groups 680 and 681. This process is repeated for each of the capacitor pairs in upper groups 610 and 611.

If capacitor groups 660, 661, 680 and 681 are also used to implement a differential analog to digital converter, the capacitor ratios of groups 660 and 661 also need to be quantized in the same manner as above. However, in this case, lower groups 630 and 631 are now used to derive the digital representation of the ratio signals for upper groups 660 and 661.

Figure 7:
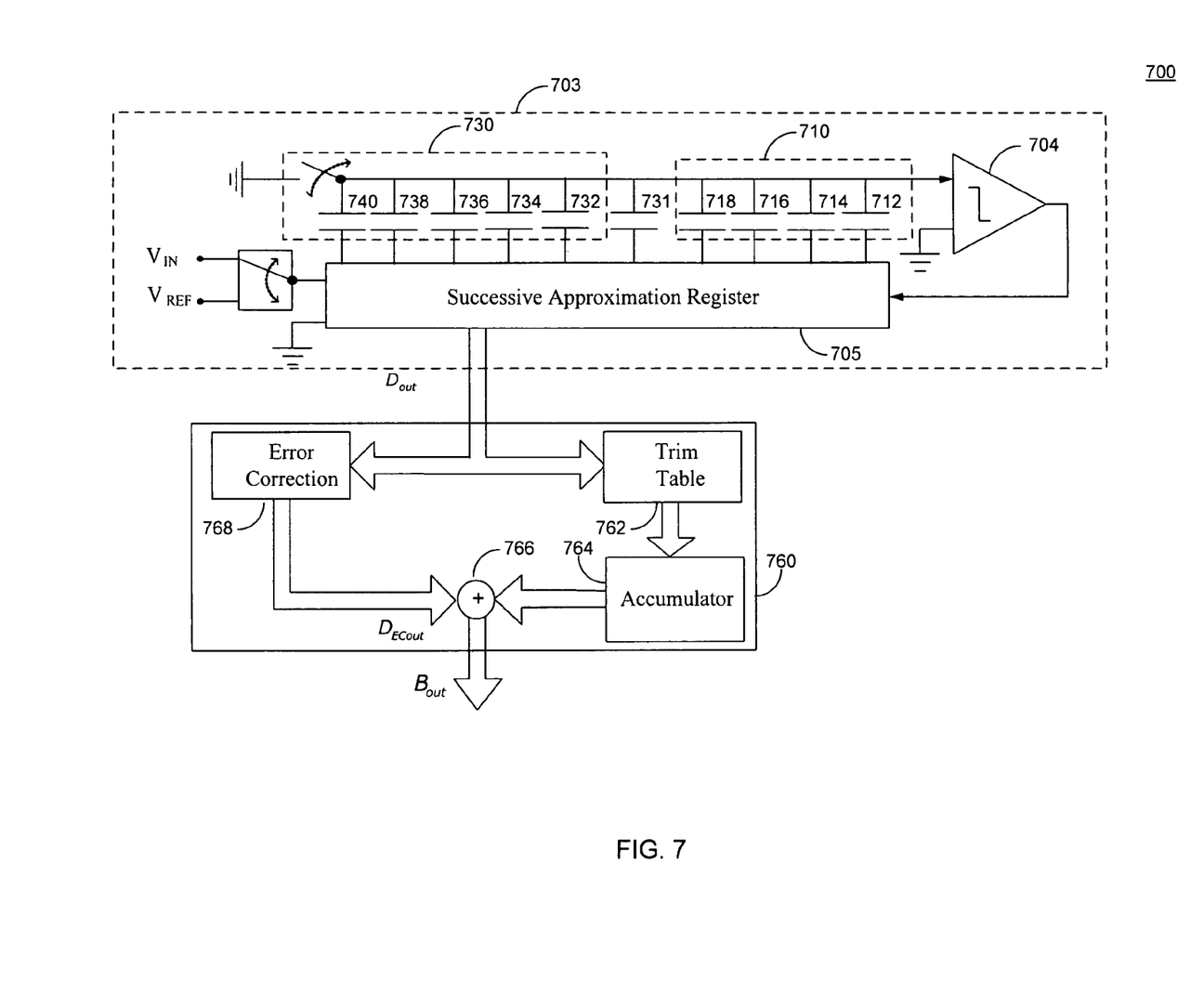
FIG. 7 is a schematic diagram of a portion of an analog to digital conversion circuit using the circuit depicted in FIG. 1 in accordance with an embodiment of the present invention.

FIG. 7 is a schematic diagram of an analog to digital converter constructed in accordance with the principles of present invention. As shown, circuit 700 employs a circuit 703, which is the same as or similar to the circuits described in FIGS. 1-6 for performing the calibration and conversion techniques described above. A circuit similar to the circuit 100 is depicted for the purpose of illustration.

As shown, circuit 700 includes circuit 703 having comparator 704, successive approximation register 705, comparison capacitors 712, 714, 716, and 718 in the upper group 710, overlap capacitor 731 and capacitors 732, 734, 736, 738 and 740 in the lower group 730 and digital correction circuit 760 including trim table 762, accumulator 764, summing node 766 and error correction circuit 768.

During initial power up, circuit 700 may perform the calibration process described above to populate trim table 762 with the appropriate correction factors for each of the MSB capacitors in the upper group. Generally speaking, only MSB capacitors in the upper group have trim table entries (although some embodiments may have trim table entries for some or all lower group capacitors as well, based on, for example, an initial calibration at fabrication, etc.).

After the calibration is complete, circuit 700 may transition from calibration mode to the conversion mode of operation. This transition may be governed by control logic in the successive approximation register (SAR) 705 or elsewhere in circuit 700 (not shown). During conversion mode, an analog input signal $V_{IN}$ is coupled to the analog to digital converter 703 which quantizes the input signal. Once the SAR conversion is complete, the raw, untrimmed quantized input signal $D_{OUT}$ is used to select the appropriate trim values from trim table 762.

For example, during operation, each bit in the raw quantized output signal $D_{OUT}$ is analyzed by trim table 762. If a certain bit is a logic high, the corresponding trim value for that bit is obtained by trim table 762 and sent to accumulator 764. Each bit of the raw quantized output signal is similarly analyzed, and all the trim values are added together in accumulator 764 to generate a total trim value. The total trim value is then added to $D_{OUT}$ in summing node 766 to generate the corrected output word $B_{OUT}$. In some embodiments, the digital correction circuit 760 may be inactive or in a micro-power mode until the SAR conversion in circuit 703 is complete and the untrimmed output signal $D_{OUT}$ is ready for further processing.

This type of conversion may be referred to as an "out of the loop" conversion because the trim table correction factors are applied substantially directly, to the untrimmed digital output signal $D_{OUT}$ at accumulator 764 after the SAR conversion is complete rather than through a feedback loop where a comparator is constantly generating results based on an applied analog correction factor as is common in the prior art. Further, because quantized trim values are summed in accumulator 764 during the out of the loop conversion, quantization errors from the all-digital correction of the SAR conversion may be cumulative. This may necessitate the addition of one or more sub LSB capacitors to the lower group 730 in order to quantize the ratio signals to a greater resolution (not shown). Higher resolution digital ratio signals may result in higher resolution trim values in trim table 762 such that the effects of quantization errors are minimized.

The out of the loop conversion process described above provides several advantages over conventional systems. In the first instance, the absence of a feedback loop allows converter 700 to operate as if no calibration is being performed. This eliminates the switching noise associated with the application of analog correction factors to certain SAR capacitors. It also reduces the switching load on $V_{REF}$. Further, because the digital calculations are performed after the SAR conversion is complete, digital noise generated by digital correction circuit 760 will generally not affect the performance of the analog components in circuit 703 during the SAR conversion. As a result of these benefits, converter circuit 700 generates more accurate conversion results and may, in some instances, operate at faster speeds and may be constructed such that it has a higher resolution as compared to prior art systems.

In operation, converter circuit 700 may experience a condition where undesirable ratios of the capacitors produce "wide code" errors. In this case, during the SAR quantization process, the upper group of capacitors in circuit 703 may generate a charge too large to be accurately offset by the lower group of capacitors. This may result in two significantly different analog input signals generating the same untrimmed output signal $D_{OUT}$ from circuit 703. Digital correction circuit 760 typically cannot differentiate among such signals. Thus, wide code errors generally cannot be corrected by the digital correction circuit 760.

One way to correct for this condition is by the addition of one or more "overlap bits" to the lower group of quantization capacitors. One such overlap bit is represented by quantization capacitor 731 which may have a value substantially equal to the MSB of the lower group of quantization capacitors (i.e., capacitor 732). This provides additional charge storage capacity to offset the relatively large magnitude charge produced by the upper group of quantization capacitors to ensure a wide code error condition does not occur. The overlap bit provides an expanded range and thus additional information that allows additional correction factors to be applied to such signals.

For example, error correction block 768 may monitor output signals $D_{OUT}$ to determine whether any overlap bits are present. If so, additional error correction factors specific to the overlap bit(s) are provided to summing node 766 when the trim values are applied to produce a precision output signal $B_{OUT}$.

Overlap capacitor 731 may also require calibration. Therefore, trim table 762 also contains trim information for the overlap bit. Consequently, the untrimmed digital output code along with the overlap bit, $D_{OUT}$, rather than the error corrected code, $D_{EC\_OUT}$, is passed on to the trim table 762.

Although preferred embodiments of the present invention have been disclosed with various circuits connected to other circuits, persons skilled in the art will appreciate that it may not be necessary for such connections to be direct and additional circuits may be interconnected between the shown connected circuits without departing from the spirit of the invention as shown. Moreover, although the invention has been illustrated herein in the context of analog to digital and digital-to-analog converters, it will be understood that it is applicable to any circuit in which determining component ratios or component measurement is desired.

Furthermore, although the invention has been illustrated using capacitors, it will be understood that other types of components such as inductors and resistors may be used if desired. Further still, although the embodiments herein have been described in the context of voltage signals, it will be understood that it is contemplated that in other embodiments these voltages signals may be replaced with current signals, charge signals, or other electrical energy signals (with the appropriate components) without departing from the spirit and scope of the present invention.

Persons skilled in the art also will appreciate that the present invention can be practiced by other than the specifically described embodiments. The described embodiments are presented for purposes of illustration and not of limitation, and the present invention is limited only by the claims which follow.

What is claimed is:

1. A method for deriving a representation of a ratio characterizing a plurality of elements comprising the steps of:
   providing a subset of elements selected from the plurality of elements, the subset of elements having substantially known ratios;
   providing an element from the plurality of elements that is not part of the subset that affects the ratio;
   producing a signal characterizing the ratio using the element and the subset of elements of the plurality; and
   deriving the representation using the subset of elements.

2. The method of claim 1 further comprising providing an additional element from the plurality of elements that is not part of the subset and that affect the ratio.

3. The method of claim 1 wherein the step of producing the signal characterizing said ratio further comprises:
   providing a first reference level;
   providing a second reference level;
   selectively coupling each of the elements between the first and second reference levels.

4. The method of claim 1 wherein the plurality of elements are embodied in an analog to digital converter.

5. The method of claim 1 wherein the plurality of elements are embodied in a digital to analog converter.

6. The method of claim 1 wherein deriving the representation further comprises use of a successive-approximation algorithm.

7. The method of claim 1 wherein the plurality of elements comprise capacitors.

8. The method of claim 1 wherein the plurality of elements comprise resistors.

9. The method of claim 1 further comprising converting the representation to a digital correction factor.

10. The method of claim 9 further comprising combining the digital correction factor with a substantially uncorrected digital signal representing an analog input signal to generate a corrected digital output signal.

11. The method of claim 1 wherein the subset of elements are capacitors that represent least significant bits in the analog to digital converter.

12. The method of claim 1 wherein the element is a capacitor that represents a most significant bit in the analog to digital converter.

13. The method of claim 1 further comprising using the subset of elements to quantize an analog input signal.

14. The method of claim 1 wherein providing the additional element further comprises using the additional element to quantize an analog input signal.

15. An electronic circuit that generates a signal which represents a proportionality of circuit components comprising:
   a plurality of circuit components for processing an input signal having a first sub-plurality and a second sub-plurality, wherein the proportionality of components in the second sub-plurality is substantially known; and
   wherein at least one component in the first sub-plurality is compared to at least the second sub-plurality of components such that the second sub-plurality of components generates a digital ratio signal representing the proportionality of the at least one component in the first plurality with respect to at least the second sub-plurality of components.

16. The electronic circuit of claim 15 wherein the second sub-plurality of elements are capacitors that represent least significant bits in an analog to digital converter.

17. The electronic circuit of claim 16 wherein the second sub-plurality of components includes an offset capacitor that allows the second sub-plurality to quantize positive and negative ratio signals.

18. The electronic circuit of claim 15 wherein the first sub-plurality of elements are capacitors that represent most significant bits in an analog to digital converter.

19. The electronic circuit of claim 15 wherein the plurality of elements is used to quantize an analog input signal during conversion mode.

20. The electronic circuit of claim 15 wherein the first and second sub-pluralities of components are selected based on manufacturing tolerances of the electronic circuit.

21. The electronic circuit of claim 15 wherein the first and second sub-pluralities of components are selected based on comparison results.

22. The electronic circuit of claim 15 wherein the digital ratio signal representing the proportionality of the at least one component is generated using a successive approximation algorithm.

23. The electronic circuit of claim 15 wherein the signal representing the proportionality of the at least one component is converted to a digital correction factor for use in a data conversion circuit.

24. The electronic circuit of claim 23 wherein the digital correction factor is combined with a substantially uncorrected digital signal representing an analog input signal to generate a corrected digital output signal.

25. The electronic circuit of claim 15 wherein:
   the first sub-plurality is separated into a first multiplicity of components and a second multiplicity of components, the first multiplicity being substantially similar to the second multiplicity; and
   wherein the second sub-plurality is separated into a third multiplicity of components and a fourth multiplicity of components, the third multiplicity being substantially similar to the fourth multiplicity.

26. The electronic circuit of claim 25 wherein the digital ratio signal representing the proportionality of the at least one component in the first plurality is generated using a split-DAC algorithm.

27. The electronic circuit of claim 15 further comprising:
   a third sub-plurality of components substantially similar to as the first sub-plurality; and
   a fourth sub-plurality of components substantially the similar to the first sub-plurality wherein the at least one component in the first sub-plurality is compared to the second sub-plurality of components such that the fourth sub-plurality of components generates the digital ratio signal representing the proportionality of the at least one component in the first plurality.

28. The electronic circuit of claim 27 wherein:
   the first sub-plurality is separated into a first multiplicity of components and a second multiplicity of components, the first multiplicity being substantially similar to the second multiplicity;
   the second sub-plurality is separated into a third multiplicity of components and a fourth multiplicity of components, the third multiplicity being substantially similar to the fourth multiplicity;
   the third sub-plurality is separated into a fifth multiplicity of components and a sixth multiplicity of components, the fifth multiplicity being substantially similar to the sixth multiplicity; and
   the fourth sub-plurality is separated into a seventh multiplicity of components and an eighth multiplicity of components, the seventh multiplicity being substantially similar to the eighth multiplicity.

29. The electronic circuit of claim 28 wherein the digital ratio signal representing the proportionality of the at least one component in the first plurality is generated using a split-DAC algorithm.

30. An analog to digital conversion circuit that operates in a conversion mode and in a calibration mode, the analog to digital conversion circuit comprising:
   a plurality of approximation capacitors for converting an analog input signal into a digital signal in the conversion mode, the plurality of successive approximation capacitors including an upper group of capacitors and a lower group of capacitors;
   a plurality of switches for selectively connecting the plurality of successive approximation capacitors to a first reference level and second reference level, wherein during the calibration mode at least one capacitor in the upper group is compared to at least the capacitors in the lower group such that the lower group of capacitors generates a digital ratio signal representing the proportionality of the at least one capacitor in upper group to at least the lower group of capacitors.

31. The analog to digital conversion circuit of claim 30 wherein the lower group of capacitors represent least significant bits.

32. The analog to digital conversion circuit of claim 30 wherein the upper group of capacitors that represent most significant bits.

33. The analog to digital conversion circuit of claim 30 wherein during the calibration mode additional approximation capacitors in the upper group are compared to approximation capacitors in the lower group and other approximation capacitors in the upper group in a substantially descending order such that approximation capacitors in the upper group previously compared to the approximation capacitors in lower group are excluded from a current comparison operation.

34. The analog to digital conversion circuit of claim 30 wherein the upper and lower capacitor groups are selected based on manufacturing tolerances of the electronic circuit.

35. The analog to digital conversion circuit of claim 30 wherein the upper and lower capacitor groups are selected based on comparison results.

36. The analog to digital conversion circuit of claim 30 wherein the digital ratio signal representing the proportionality of the at least one capacitor in the upper group is generated using a successive approximation algorithm.

37. The analog to digital conversion circuit of claim 30 wherein the signal representing the proportionality of the at least one capacitor in the upper group is converted to a digital correction factor for use in the analog to digital conversion circuit.

38. The analog to digital conversion circuit of claim 37 wherein the digital correction factor is combined with a substantially uncorrected digital signal representing the analog input signal to generate a corrected digital output signal.

39. The analog to digital conversion of claim 30 wherein the lower group of capacitors includes an offset capacitor that allows the lower group of capacitors to quantize positive and negative ratio signals generated by the upper group of capacitors.

40. The analog to digital conversion circuit of claim 30 wherein:
the upper group of capacitors is divided into a first multiplicity of capacitors a second multiplicity of capacitors, the first multiplicity of capacitors being substantially identical to the second multiplicity of capacitors; and
wherein the lower group of capacitors is separated into a third multiplicity of capacitors and a fourth multiplicity of capacitors, the third multiplicity of capacitors being substantially to the fourth multiplicity of capacitors.

41. The analog to digital conversion circuit of claim 40 wherein the digital ratio signal representing the proportionality of the at least one component in the first plurality is generated using a split-DAC algorithm.

* * * * *